US006423477B1

(12) United States Patent
Engelen et al.

(10) Patent No.: US 6,423,477 B1
(45) Date of Patent: Jul. 23, 2002

(54) METHOD OF MANUFACTURING A STAMPER FOR PRODUCING OPTICAL DISCS, A STAMPER THUS OBTAINED AND AN OPTICAL DISC OBTAINED BY USING SUCH A STAMPER

(75) Inventors: Thomas Wilhelmus Engelen, Utrecht; Walter T. M. Stals, Nederweert; Jacobus J. T. T. Vermeijlen, Eindhoven, all of (NL)

(73) Assignee: Odme International B.V., Veldhoven (NL)

( * ) Notice: Subject to any disclaimer, the term of this patent is extended or adjusted under 35 U.S.C. 154(b) by 0 days.

(21) Appl. No.: 09/529,011

(22) PCT Filed: Oct. 7, 1998

(86) PCT No.: PCT/NL98/00576

§ 371 (c)(1),
(2), (4) Date: Jun. 26, 2000

(87) PCT Pub. No.: WO99/18572

PCT Pub. Date: Apr. 15, 1999

(30) Foreign Application Priority Data

Oct. 7, 1997 (NL) .............................................. 1007216

(51) Int. Cl.⁷ ................................................. G11B 7/26
(52) U.S. Cl. ...................... 430/321; 430/321; 430/328; 430/330
(58) Field of Search ................................ 430/320, 321, 430/330, 328

(56) References Cited

FOREIGN PATENT DOCUMENTS

| EP | 0 667 608 A | | 8/1995 |
| JP | 2-173285 | * | 7/1990 |
| JP | 6-302016 | * | 10/1994 |

OTHER PUBLICATIONS

Allen R. et al: "Deep U.V. Hardening of Positive Poltoresist Patterns" Journal of the Electrochemical Society, vol. 29, No. 6, Jun. 1982, pp. 1379–1381, XP002047660 see pp. 1379–1380.

Hiraoka & Pacansky: "UV–Hardening of Resist Patterns" IBM Technical Disclosure Bulletin, vol. 24, No. 3, Aug. 1981, p. 1468 XP002067935 see p. 1468.

"Photoresist Stabilization System" Solid State Technology, vol. 27, No. 7, Jun. 1984, pp. 45–46, XP002067936 Washington, New York, USA see pp. 45–46.

* cited by examiner

Primary Examiner—John A. McPherson
(74) Attorney, Agent, or Firm—Pillsbury Winthrop LLP

(57) ABSTRACT

The invention relates to a method of manufacturing a stamper for producing optical disks, comprising the application of a photoresist to a stamper plate and the structuring of the applied photoresist film. The structuring comprises the successive exposure, development and heating of the photoresist film. The developed photoresist film is subjected to an additional exposure in the deep UV range prior to the final heat treatment. The invention also relates to a stamper and to an optical disk obtained using the stamper.

11 Claims, No Drawings

METHOD OF MANUFACTURING A STAMPER FOR PRODUCING OPTICAL DISCS, A STAMPER THUS OBTAINED AND AN OPTICAL DISC OBTAINED BY USING SUCH A STAMPER

FIELD OF THE INVENTION

The present invention relates to a method of manufacturing a stamper for producing optical discs, comprising the application of a photoresist to a stamper plate and the structuring of the applied photoresist film, wherein said structuring comprises the successive exposure, development and heating of said photoresist film, wherein the developed photoresist film is subjected to an additional exposure step in the deep UV range prior to the final heat treatment. The present invention furthermore relates to a stamper for producing optical discs and to optical discs obtained by means of such a stamper.

BACKGROUND OF THE INVENTION

A method of this kind is known from Dutch patent application no. 9400225 filed in the name of the present applicant. According to the method of manufacturing a stamper described therein, a photoresist film is applied to a stamper plate, after which the applied photoresist film is structured. The structuring of the applied photoresist film comprises the successive selective exposure and development of the applied photoresist film, wherein the structuring of the applied photoresist film furthermore comprises, in particular as an additional step, the heating of the selectively exposed photoresist film. In addition to that, the structuring of the applied photoresist film furthermore comprises the integral exposure of the photoresist film prior to developing the photoresist film. The successive steps of selective exposure, heating and integral exposure prior to the developing step are also known as "image reversal process" to those skilled in this field of the art. According to the example carried out in said Dutch patent application, a negative photoresist was coated, by means of spin-on deposition, onto a blank 300 μm thick nickel shell, which was glued on a standard 8-inch CD glass substrate for this experiment. After dry-spinning of the nickel shell/glass substrate assembly at a constant temperature of 80° C., the applied negative photoresist film was dried. After cooling, the assembly was exposed by means of a master registration system (MRS) at a wavelength of 459 nm. Directly after said exposure, the assembly was heated and subsequently cooled, after which integral exposure took place for 4 minutes. Thus, the non-exposed parts of the negative photoresist film applied to the nickel shell were exposed as yet. The assembly was subsequently developed and heated again, in the same manner as after the exposure, for the purpose of fixating the structure of the photoresist posts, after which cooling took place, with this difference that the oven temperature set for heating was now 140° C.

In practice, however, this latter heat treatment, also called hardbake, has been carried out at a temperature of 200° C. the last few years. A drawback of this relatively high temperature of the final heat treatment is the fact that the so-called photoresist posts formed after the developing step lose their structure or geometry in an uncontrolled manner, as a result of which they will flow out more or less. Since the geometry of the photoresist posts will change as a result of the necessary heat treatment at a high temperature, the obtained stamper often does not meet the precise specifications that are required for producing optical discs, which is undesirable.

SUMMARY OF THE INVENTION

Consequently, it is an object of the present invention to provide a method of manufacturing a stamper as referred to in the introduction, which method eliminates the aforesaid problems.

Another object of the present invention is to provide a method of manufacturing a stamper as referred to in the introduction, which method allows or effects a certain amount of flowing of the photoresist posts, making it possible to control the desired post geometry which is required for mass replication.

DETAILED DESCRIPTION

Surprisingly, the above objectives have been accomplished by the present inventors by providing a method as referred to in the introduction, which is characterized in that the effective dose of said additional exposure step ranges between $4 \cdot 10^{-4}$ and $5 \cdot 10^{-2}$ J/cm² with a wavelength of 200–320 nm.

According to the present invention, the effective dose or energy density of the additional exposure step thus ranges between $4 \cdot 10^{-4}$ and $5 \cdot 10^{-2}$ J/cm², preferably between $8 \cdot 10^{-4}$ and $1.2 \cdot 10^{-2}$ J/cm². If the effective dose of the additional exposure step according to the present invention is less than $4 \cdot 10^{-4}$ J/cm², no suffficient crosslinking effect will occur in the photoresist film. If the effective dose of the additional exposure step according to the present invention is more than $5 \cdot 10^{-2}$ J/cm², no significant crosslinking effect will occur in the photoresist film. According to the present invention, the term effective dose is understood to mean the product of the dose and the sensitivity of the exposed material at the wavelength used. For novolac resin, for example, the maximum sensitivity is at a value of $\lambda$=250 nm, as a result of which the energy dose being used at a wavelength of 250 nm substantially corresponds with the effective dose. It is apparent that a wavelength other than 250 nm will require a higher energy dose in order to obtain the same effective dose and thus the same effect as when a wavelength of 250 nm is used.

Although it is known from the article "Deep UV hardening of positive photoresist patterns", Journal of the Electrochemical Society, part 29, No. 6, June 1982, pages 1379–1381 in the name of Allen R. et al. to reduce the thermal deformation, in particular the flowing of photoresist patterns, during treatments at a high temperature of 180° C. for 30 minutes by exposing the photoresist in the deep UV range by means of a low-pressure mercury vapour lamp, said article discloses an exposure of for example 8 mW/cm² for 20 minutes, which corresponds with an energy dose of 9,6 J/cm². Such a dose in accordance with the article of Allen R. et al. is substantially higher than the effective dose in the range of $4 \cdot 10^{-4}$–$5 \cdot 10^{-2}$ J/cm² and a wavelength of 200–320 nm which the present invention employs, which dose makes it possible to control said flowing, thus making it possible to control the geometry of the photoresist posts being formed.

The use of an additional exposure step before the hardbake step is also known from the articles "UV-hardening of Resist Patterns", IBM Technical Disclosure Bulletin, part 24, No. 3, August 1981, and from the article "Photoresist Stabilization System", Solid State Technology, part 27, No. 7, June 1984, Washington, USA, but neither article discloses any exposure energy values. Said use corresponds with the aforesaid article by Allen, R et al., however, in particular IC lithography, so that it is likely that the energy values being employed will also be the same as in said article, that is, considerably higher than the values employed according to the present invention.

Such an additional exposure step according to the present invention with a very effective dose will probably result in oxidation reactions in the photoresist, in particular in the outer layers of the photoresist, which oxidation reactions lead to curing and a higher glass transition temperature. As a result of that, the structure of the photoresist posts formed during the developing step will not be adversely affected by the subsequent heat treatment at a high temperature, and it will probably be controllable. However, the invention is not limited by this assumption regarding the oxidation reaction that will probably occur.

The additional exposure step according to the invention, which is to be carried out prior to the final heat treatment, is preferably carried out in the range in which the photochemical curing of the photoresist takes place, that is, in the range in which absorption of the electromagnetic radiation takes place, in particular in the range of 200–320 nm, more in particular in the range of 240–260 nm.

The selection of the wavelength range to be used for the additional exposure step has an influence on the curing process of the photoresist. Although the scientific explanation as regards the relation between the wavelength and the curing of the photoresist is not quite clear to those skilled in this field of the art, the present inventors assume that the following applies. It should be understood thereby that the present inventors are by no means limited by such an explanation. In the long wavelength range, for example 300–320 nm, the penetration depth of the UV radiation is great, and complete curing of the photoresist will take place. When a wavelength of 240–260 nm is used, the absorption by the photoresist will be large, as a result of which the penetration depth of the UV radiation will be small and only curing of the outermost layer of the photoresist will take place, therefore. In this latter embodiment, the combination of the very effective dose of the additional exposure step, exposure in a specified wavelength range and subsequent heating makes it possible to influence the post geometry of the photoresist posts. If the absorption peak of the photoresist being used ranges between 240 and 260 nm, which applies to novolac resins, an additional exposure step outside the aforesaid range will not effect sufficient absorption. Inadequate curing of the photoresist film will result, which means that the structure of the photoresist posts will be affected during the subsequent heat treatment at a high temperature, with flowing out taking place to a larger or smaller degree, which is desirable in certain embodiments.

The exposure time of the additional exposure step according to the present invention is preferably 1–125 seconds, more preferably 2–30 seconds. Experimental data have shown that an exposure time of less than 1 second will probably lead to insufficient oxidation reactions in the photoresist film and thus to insufficient curing. An exposure time of more than 125 seconds does not have an additional effect on the oxidation reactions induced in the photoresist film. In addition to that, an exposure time of more than 125 seconds is undesirable because the photoresist posts, which mainly consist of organic material, will be slowly affected as a result of the ozone production, causing them to evaporate, mainly in the form of $H_2O$ and $CO_2$. Moreover, when such a long exposure time, the heat production caused by the additional exposure step according to the present invention will be high, as a result of which the temperature may rise to above the glass transition temperature, which will have an adverse effect on the geometry of the photoresist posts as yet.

In a preferred embodiment of the method according to the invention, the additional exposure step is carried out under rotation. Since the stamper is rotated during said additional exposure, a crosslinking effect occurs in the photoresist film over the entire area of the stamper, as a result of which a satisfactory evenness is achieved.

In addition to that, it is preferred to carried out the additional exposure step under heating. As a result of said heating, the crosslinking effect in the photoresist film will take place more quickly, as a result of which the exposure time of the additional exposure step according to the present invention can be reduced, which results in a higher production speed.

With the method according to the present invention, a negative photoresist is preferably used for applying the photoresist film. Exposed areas of a film of a negative photoresist remain after developing, whilst the non-exposed areas are removed as a result of the developing step. The method according to the present invention is not limited to the use of a special negative photoresist, however. More in particular, the method according to the present invention is suitable for influencing the post geometry of photoresist posts, irrespective of the special origin of the photoresist being used, that is, a positive photoresist or a negative photoresist. By applying a negative photoresist to a stamper plate, which might in principle be placed directly in the injection moulding unit, and structuring said negative photoresist in accordance with the proposed method, both the metallisation step and the electroplating step may be skipped.

In a preferred embodiment of the method according to the invention, the exposure step, which is not the additional exposure step according to the present invention, is carried out in two steps, that is, a first selective exposure step and a second integral exposure step. By selectively exposing the negative photoresist, an acid is formed in the exposed areas. The heating of the negative photoresist following said selective exposure step will lead to crosslinking of said photoresist in the exposed areas under catalysis of said acid. As a result of the integral exposure step, an acid is formed in the non-exposed areas as well, which acid causes the areas which have not been selectively exposed, and which are thus not crosslinked, to dissolve sooner during the developing step. As a result of the heating step following the developing step, the selectively exposed and thus crosslinked areas are strengthened by further crosslinking of polymer chains, whereby such a heating step is according to the present invention preceded by an additional exposure step as already described above.

The present invention furthermore relates to a stamper for producing optical discs, which stamper is characterized in that it has been obtained by using the method according to the present invention.

The present invention furthermore relates to an optical disc, which disc is characterized in that it has been obtained by using the stamper according to the present invention.

The present invention will be described in more detail hereafter with reference to special examples. It should be understood, however, that the present invention is by no means limited to such special examples. Furthermore it will be understood that the examples described can be slightly adapted by persons skilled in this field of the art without departing from the essence of the present invention as defined in the appended claims.

EXAMPLE 1

In order to investigate the effect of an additional exposure step, a number of stampers were produced, wherein the same process parameters were used for all examples, with the exception of the exposure time and the dose being used. A mercury vapour lamp type HOK 4/120SE-UV (Philips) was used as the exposure source. This lamp comprises a spectrum in the range of 200–300 nm, with a peak being detectable at a wavelength of 250 nm. The effect of the additional exposure step on the post geometry was determined on the basis of post profile measurements on the AFM and order measurements on the HD-DOM.

The following settings were used:

| | |
|---|---|
| Photoresist: | AZ5214E, spin-on deposition at 600 revolutions per minute |
| First heating step: | 90° C., 5 minutes |
| Laser beam registration apparatus (LBR): | NA 0.45, laser wavelength: 413 nm |
| Second heating step: | 2 minutes, PLS (380 nm UV lamp) |
| Developing step: | developer:demineralized water ratio: 1:3.5 |
| Additional exposure step according to the present invention: | for 0, 15, 60 or 150 seconds |
| Final heating step: | 200° C., for 5 minutes |

The results of the AFM measurements on the stampers obtained under varying conditions of the exposure step (following the final heating step at 200° C. for 5 minutes) are summarized in the table below.

| Sample number | Exposure time (seconds) | Dose (J/cm$^2$) | Post height (nm) | Post width at half height (nm) | Post width at base (nm) | Slope left-hand corner (degrees) | Slope right-hand corner (degrees) |
|---|---|---|---|---|---|---|---|
| D148 | 0 | 0 | 157 | 691 | 1044 | 22 | 22 |
| D144 | 15 | 6·10$^{-3}$ | 175 | 550 | 685 | 56 | 60 |
| D146 | 60 | 2.4·10$^{-2}$ | 177 | 591 | 709 | 61 | 63 |
| D147 | 150 | 6·10$^{-2}$ | 163 | 580 | 709 | 56 | 57 |

The above table clearly shows the effect of the additional exposure step on the geometry of the photoresist posts. The leaving out of an additional exposure step in sample D148, which method describes the prior art, in particular Dutch patent application no. 9400225, leads to a flowed-out post geometry having the shape of a Gaussian distribution curve. From the table it can furthermore be concluded that the original post geometry is substantially retained at a dose of 6·10$^{-3}$ J/cm$^2$ (exposure for 15 seconds) already, although some flowing-out of the photoresist posts still takes place during the final heating step. It can furthermore be concluded from the table that prolongation of the exposure time after 60 seconds does not have a significant effect on the geometry of the photoresist posts. An energy dose of 6·10$^{-2}$ J/cm$^2$ leads to a decreased post height, which can probably be ascribed to the ozone production, as a result of which the photoresist posts are affected, causing them to evaporate. Additional experiments have also shown that flowing only took place to a slight degree when a short exposure time, namely 5 and 10 seconds, was used in the final heating step.

EXAMPLE 2

The same additional exposure steps as in example 1 was used, whereby each of the stampers thus treated was examined as regards the bond with Ercopell. If an additional exposure step (exposure time: 0 seconds) was not included in the treatment of the stamper, the bond with Ercopell appeared to be strong, as a result of which it was very difficult to remove Ercopell from the stamper. When an additional exposure step with an effective dose ranging between 4·10$^{-4}$ and 5·10$^{-2}$ J/cm$^2$ was carried out, the bond between the Ercopell coating and the stamper surface was sufficiently weak, so that removal of the coating was possible. This indicates that the additional exposure step has a positive effect on the surface composition of the photoresist.

EXAMPLE 3

The same steps as in example 1 were used, with this difference that the developing step was carried out while using an 0.2 M/KOH-solution, wherein the developing process took place to order, that is, the developing process was monitored by means of light diffraction. The geometry of the obtained resist structure was then determined by means of AFM measurement. Following that, the stampers thus obtained were exposed to an effective dose of the additional exposure step in the range of 0–1.5·10$^{-1}$ J/cm$^2$ and a wavelength of 250 nm. The last heating step, also called "hardbake", was carried out on a hot plate at 200° C. for 5 minutes.

The geometry of the obtained photoresist structures was determined again by means of AFM measurements for the purpose of determining the extent of deformation of the resist structures caused by the additional exposure step and the hardbake step. Said deformation is for example expressed in the parameters height retention, h, (the ratio between the height after developing and the height after the additional exposure step and hardbake, in %) and width retention, b, (the ratio between the width at half height after developing and the width at half height after the additional exposure step and hardbake, in %). The table 2 below shows a survey of the measuring data of the photoresist structures.

TABLE 2

| Sample | Effective exposure dose (J/cm$^2$) | Height retention h (%) | Width retention b (%) |
|---|---|---|---|
| A | 2,00·10$^{-4}$ | 86 | 84 |
| B | 8,00·10$^{-4}$ | 95 | 79 |
| C | 2,00·10$^{-3}$ | 98 | 89 |
| D | 2,40·10$^{-2}$ | 97 | 96 |
| E | 7,00·10$^{-2}$ | 90 | 96 |
| F | 1,40·10$^{-1}$ | 84 | 90 |

It will be apparent that both the height retention, h, and the width retention, b, are affected by the effective exposure dose. When a small exposure dose is used, that is, a dose of less than 4·10$^{-4}$ J/cm$^2$, in particular in the case of sample A, for which an effective exposure dose of 2.00·10$^{-4}$ was used, the deformation caused by substantial flowing is such that pits which are difficult to read or pits having high jitter values result. When an exposure dose having a value of more than 5·10$^{-2}$ J/cm$^2$ is used, in particular in the case of sample E and sample F, for which effective exposure doses of 7.00·10$^{-2}$ J/cm$^2$ and 1.40·10$^{-1}$ J/cm$^2$ respectively were used, the influence of oxidation caused by ozone is such, however, that the resist structure is uncontrollable and decomposition of the photoresist takes place. Thus, an effective dose of the additional exposure step in the range of 4·10$^{-4}$–5·10$^{-2}$ J/cm$^2$ and a wavelength of 200–320 is required for effecting a controlled flow in order to obtain more or less round, flown-out resist structures.

What is claimed is:
1. A method of manufacturing a stamper for producing optical discs, comprising:

applying a photoresist to a stamper plate to form a photoresist film; and structuring the photoresist film, the structuring including, in order, exposing the photoresist film;

developing the photoresist film;

heating the photoresist film;

additionally exposing the developed photoresist film to a light having a wavelength in the deep UV range; and heat treating the additionally exposed photoresist film;

wherein said additional exposing is performed using a light wavelength of 200–320 nm and an energy level between $4 \cdot 10^{-4}$ and $5 \cdot 10^{-2}$ J/cm.

2. A method according to claim 1, wherein the energy level of said additional exposing ranges between $8 \cdot 10^{-4}$ and $1.2 \cdot 10^{-2}$ J/cm$^2$.

3. A method according to claim 1, wherein an exposure time of said additional exposing ranges between 1 and 125 seconds.

4. A method according to claim 3, wherein the exposure time of said additional exposing ranges between 2 and 30 seconds.

5. A method according to claim 1, wherein the light wavelength is in the range of 240–260 nm.

6. A method according to claim 5, wherein said additional exposing is carried out under rotation.

7. A method according to claim 5, wherein said additional exposing is carried out under heating.

8. A method according to claim 1, wherein a negative photoresist is used for said applying.

9. A stamper for producing optical discs obtained by using the method according to claim 1.

10. An optical disc, obtained by using the stamper according to claim 9.

11. A method according to claim 1, wherein said exposing is carried out in two stages, comprising a first selective exposure stage and a second integral exposure stage, wherein the selectively exposed photoresist is heated prior to carrying out said second integral exposure stage.

* * * * *